United States Patent [19]

Burgie et al.

[11] Patent Number: 5,118,486
[45] Date of Patent: Jun. 2, 1992

[54] SEPARATION BY ATOMIZATION OF BY-PRODUCT STREAM INTO PARTICULATE SILICON AND SILANES

[75] Inventors: Richard A. Burgie; Owen A. Heng, both of Midland, Mich.

[73] Assignee: Hemlock Semiconductor Corporation, Hemlock, Mich.

[21] Appl. No.: 691,907

[22] Filed: Apr. 26, 1991

[51] Int. Cl.⁵ .............................. C01B 33/18
[52] U.S. Cl. .................... 423/349; 423/342; 423/347; 423/DIG. 20; 55/97
[58] Field of Search ....... 423/342, 347, 349, DIG. 20; 55/71, 85, 194

[56] References Cited

U.S. PATENT DOCUMENTS

| | | | |
|---|---|---|---|
| 4,515,762 | 4/1985 | Griesshammer et al. | 423/337 |
| 4,519,999 | 5/1985 | Coleman et al. | 423/337 |
| 4,629,771 | 12/1986 | Candlin et al. | 526/125 |
| 4,642,208 | 2/1987 | Masaru | 55/1 |
| 4,666,990 | 4/1987 | Candlin et al. | 525/268 |
| 4,881,952 | 11/1989 | Masaru | 264/37 |

FOREIGN PATENT DOCUMENTS 1185071  5/1985  Canada ............................ 423/347

Primary Examiner—Robert Kunemund
Assistant Examiner—Ken Horton
Attorney, Agent, or Firm—William F. Boley

[57] ABSTRACT

The present invention is a process for separating particulate silicon from a liquid by-product stream containing silanes. The liquid by-product stream comprising silanes and particulate silicon is atomized into a heated zone to effect vaporization of the liquid silanes, thus drying the particulate silicon. The dried particulate silicon is separated from the gaseous silanes by filtration or other suitable means. The separated solid and gaseous phases may be used as feed to the process generating the by-product stream or as a feed for other processes.

21 Claims, 4 Drawing Sheets

SEPARATION BY ATOMIZATION OF BY-PRODUCT STREAM INTO PARTICULATE SILICON AND SILANES

BACKGROUND OF THE INVENTION

The present invention is a process for separating particulate silicon from a liquid or liquid by-product stream containing silanes. The described process comprises atomizing a liquid by-product stream containing a slurry of silanes and particulate silicon into a heated zone to effect vaporization of the liquid silanes, thus drying the particulate silicon. The particulate silicon is separated from the gaseous silanes by filtration or other suitable means. The separated solid and gaseous phases may be used as feed to the process generating the by-product stream or as a feed for other processes.

The present process is particularly useful for the recovery of silanes from the by-product stream resulting from the chemical vapor deposition (CVD) of silanes to form elemental silicon.

A typical by-product stream of a CVD process for forming elemental silicon from silanes contains silanes, disilanes, and finely dispersed particulate silicon. A common method for treating this by-product stream is incineration. Incineration methods typically require that the by-product stream be dilute in order to avoid hazardous concentrations of pyrophoric disilanes. This requirement results in large volumes, which makes the incineration process costly. The present process not only avoids the cost of incineration, but allows the silanes and particulate silicon to be recovered and recycled to the CVD process or used as feed materials for other processes.

Prior patents for treatment of by-products from a chemical vapor deposition process disclose treatment of a one-phase by-product comprising either a gaseous mixture or particulate silicon.

Masaru, U.S. Pat. No. 4,642,208, issued Feb. 10, 1987; and Masaru, U.S. Pat. No. 4,881,952, issued Nov. 21, 1989, disclose a method of capturing particulate silicon produced during a CVD process for forming amorphous silica films. The particulate silicon is collected by a vacuum suction means and mixed with a heat distillable liquid having an affinity for silicon, to form a slurry. The slurry is heat-distilled to form pellets or a solid mass.

Griesshammer et al., U.S. Pat. No. 4,515,762, issued May 7, 1985, describes a method of processing a by-product gaseous mixture from a silicon deposition process. The by-product gases comprise trichlorosilane, tetrachlorosilane, hydrogen, and hydrogen chloride. Chlorosilanes are recovered from the gaseous mixture by condensation. The remaining gaseous mixture is combusted in the presence of oxygen and a chloride to form oxide particles and recoverable hydrogen chloride gas.

Candlin et al., U.S. Pat. No. 4,666,990, issued May 19, 1987; and Candlin et al., U.S. Pat. No. 4,629,771, issued Dec. 16, 1986, describe a process for the preparation of a catalyst impregenated with one or more transition metal compounds. This process comprises forming a suspension from an inert liquid medium and at least one solid material, the suspension containing a compound of a transition metal which is either dissolved in the inert liquid medium or is present as a solid material suspended in the inert medium. Spray drying is used as a method of evaporating the inert liquid medium for the purposes of (1) separating the particulate material from the inert liquid medium; and (2) allowing the dissolved transition metal to coat the particulate material and forming the transition metal catalyst.

The described art does not teach the instant process where a by-product, containing particulate silicon suspended in liquid silanes, is separated by atomizing the by-product into a heated zone which causes vaporization of the liquid silanes, thus facilitating separation of the silanes from the particulate silicon.

SUMMARY OF INVENTION

The present invention is a process for separating particulate silicon from a liquid or liquid by-product stream containing silanes. The liquid by-product stream, comprising silanes and particulate silicon, is atomized into a heated zone to effect vaporization of the liquid silanes, thus drying the particulate silicon. The particulate silicon is separated from the gaseous silanes by filtration or other suitable means. The separated solid and gaseous phases may be used as feed to the process generating the by-product stream or as a feed for other processes.

DESCRIPTION OF THE DRAWINGS

Figure 1:
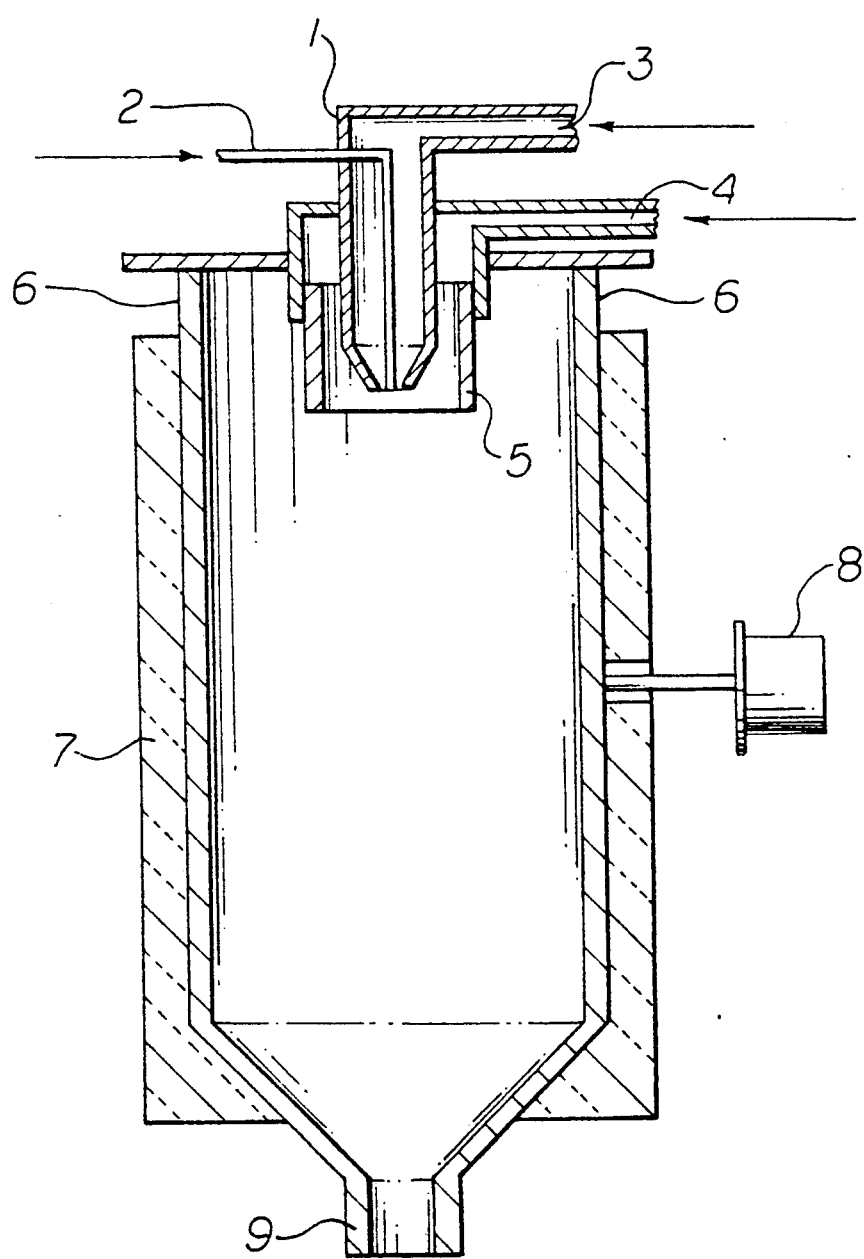
FIG. 1 is a cross-section of one configuration of a vaporization chamber and an atomizing nozzle suitable for use in the present invention.

In FIG. 1, vaporization chamber 6, comprising a cylindrical upper section and a conical lower section, contains atomizing nozzle 1, for feeding a liquid by-product stream into vaporization chamber 6 and for atomizing the liquid by-product stream. Atomizing nozzle 1 comprises two concentric channels. Inner concentric channel 2 is used to feed the liquid by-product stream into vaporization chamber 6. Outer concentric channel 3 feeds a high pressure atomizing gas into vaporization chamber 6. The high pressure atomizing gas from outer concentric channel 3 and the liquid by-product stream from inner concentric channel 2 mix upon expulsion into vaporization chamber 6, resulting in the atomization of the liquid by-product stream. A preheated gas is passed through port 4 to create a heated zone in vaporization chamber 6 for evaporating the atomized liquid by-product. Vertically adjustable flange 5 is used to adjust the spray angle of the atomized liquid by-product stream within the heated zone.

Vaporization chamber 6 is enclosed in heated jacket 7, through which a heated fluid can be passed, to maintain the temperature in vaporization chamber 6 at a value above the dew point of the gaseous mixture containing gaseous silanes, high pressure atomizing gas, and preheated gas. Particle remover device 8 is contacted with the walls of vaporization chamber 6 to provide a means of removing particulate silicon from the walls of vaporization chamber 6.

Figure 2:
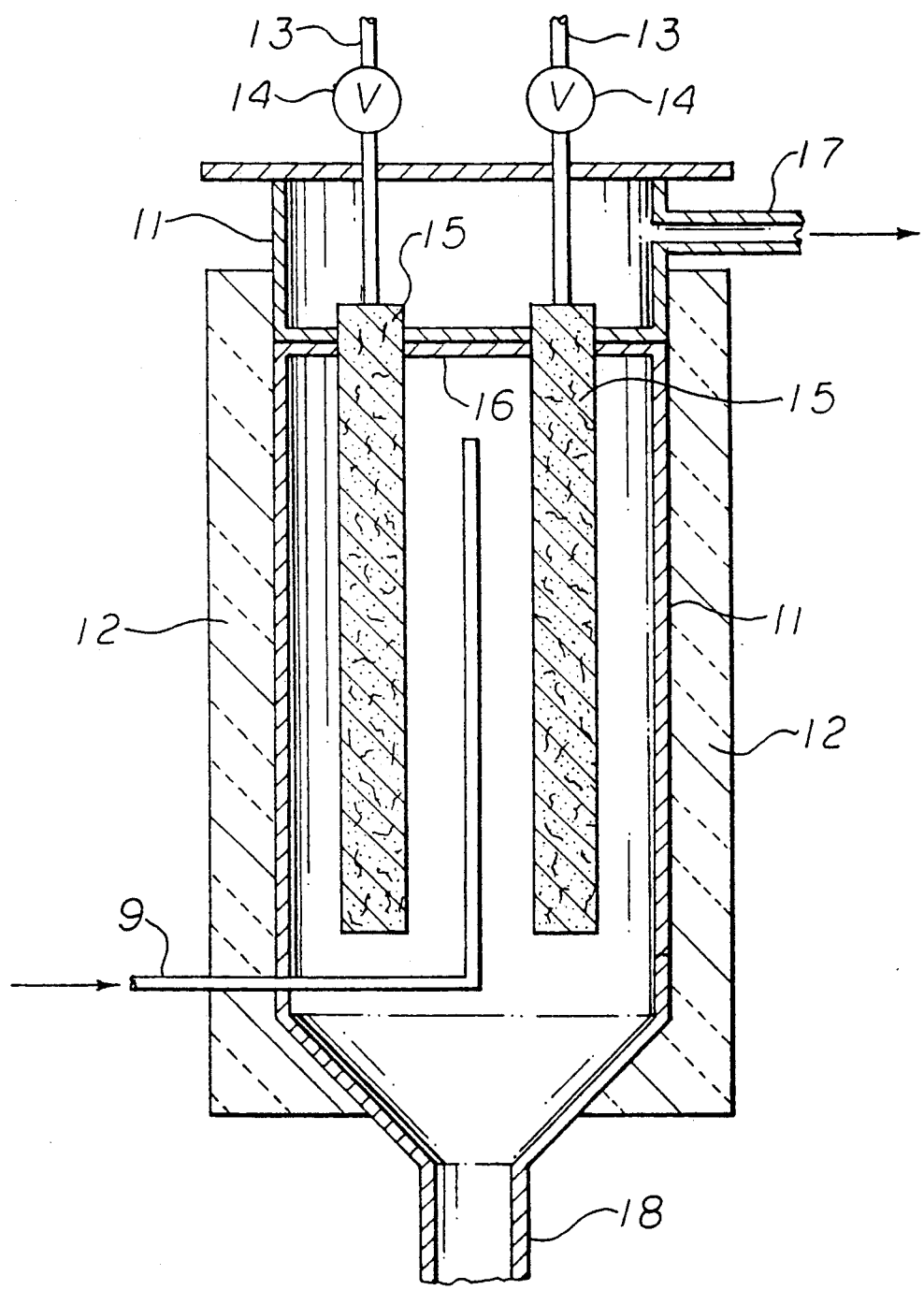
FIG. 2 is a cross-section of a filtration chamber which can be used to complete the separation of the gaseous silanes and the particulate silicon.
Figure 3:
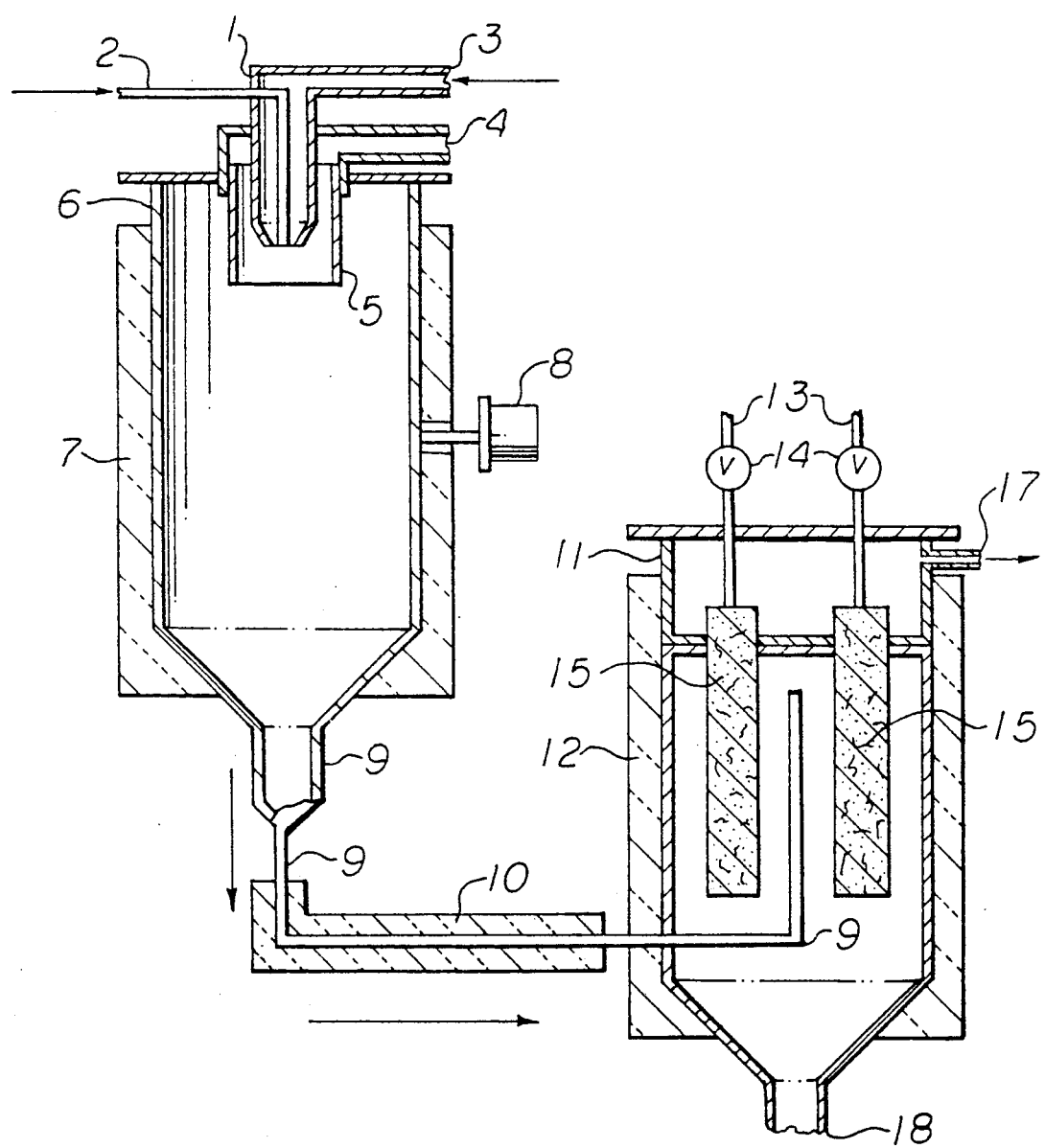
FIG. 3 is a flow diagram of a separation process employing a vaporization chamber and a separate filtration chamber.

The resulting particulate silicon entrained in the gaseous mixture containing silanes can be passed from vaporization chamber 6 by conduit 9 to filtration chamber 11, as represented in FIG. 3. Conduit 9 is enclosed in heated jacket 10, through which a heated fluid can be passed, to maintain the temperature in conduit 9 at a value above the dew point of the gaseous mixture containing silanes. Conduit 9 enters filtration chamber 11 near the bottom and extends toward the top of filtration chamber 11, as illustrated in FIG. 2, creating a downward flow of the gaseous mixture containing silanes and particulate silicon.

Filtration chamber 11 (FIG. 2), contains filter elements 15. Filter elements 15 are attached to a retainer plate 16 for suspending filter elements 15 in filtration chamber 11. A purge gas is periodically pulsed through ports 13 to remove particulate silicon from filter elements 15. Pressure valve 14 controls the passage of the purge gas into filtration chamber 11. Filtration chamber 11 is enclosed by heated jacket 12, through which a heated fluid can be passed, to maintain the temperature in filtration chamber 11 at a value above the dew point of the gaseous mixture containing silanes. The gaseous mixture containing silanes exit from filtration chamber 11 through port 17. Particulate silicon can be removed from filtration chamber 11 through port 18.

Figure 4:
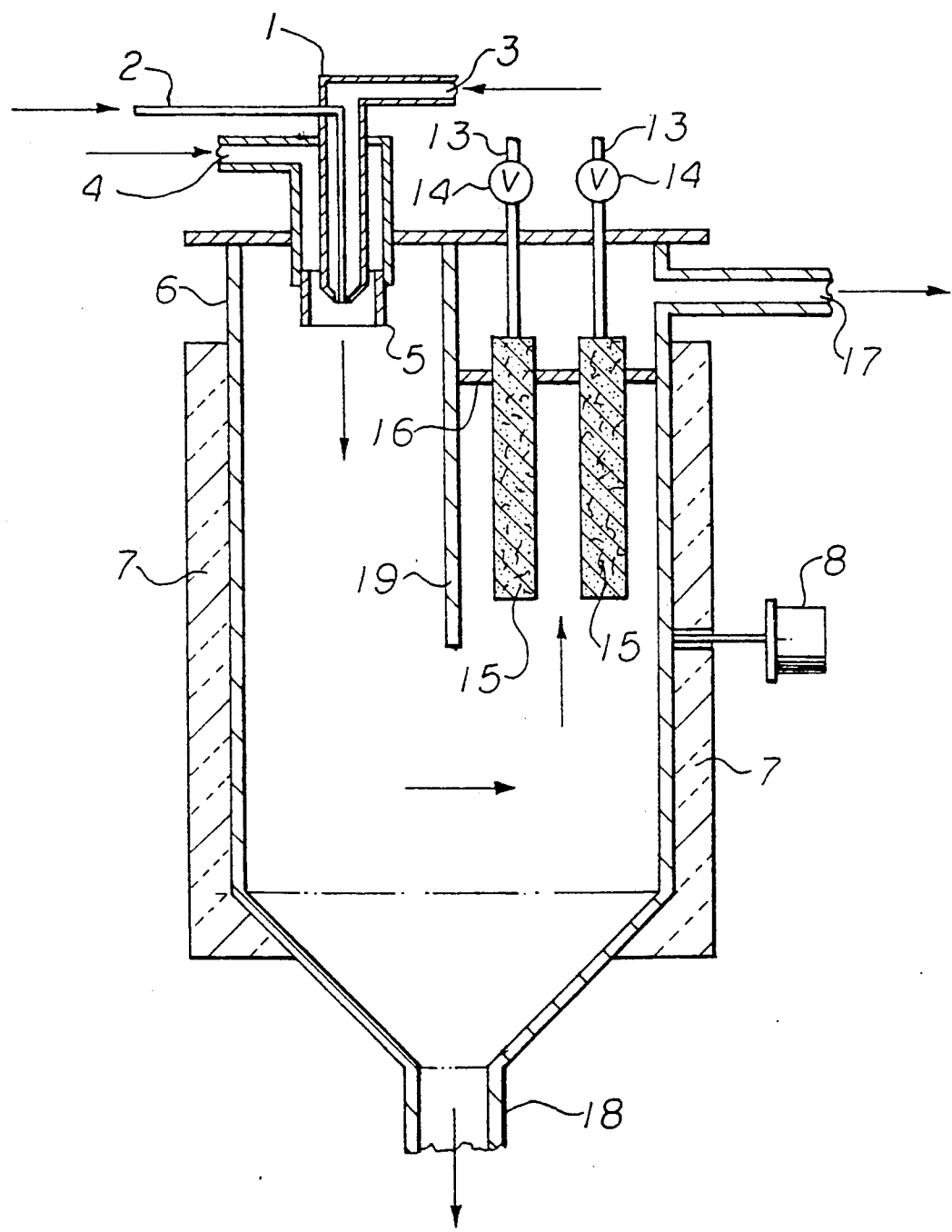
FIG. 4 is a cross-section of an embodiment of the present invention in which the filter system is incorporated within the vaporization chamber.

In another embodiment of the instant invention (FIG. 4), filter elements 15 are incorporated within vaporization chamber 6. Vaporization chamber 6 is separated into vaporization and filtration sections by divider 19.

DESCRIPTION OF THE INVENTION

The present invention is a process for separating particulate silicon from a liquid or liquid by-product stream containing silanes. The process comprises:
(A) atomizing a liquid by-product stream comprising silanes and particulate silicon,
(B) passing the atomized by-product stream through a heated zone maintained at a temperature sufficient to convert the silanes to gaseous silanes and
(C) separating the gaseous silanes from the particulate silicon.

The present process separates a by-product stream comprising liquid silanes and particulate silicon into a gaseous silanes component and particulate silicon. The silanes can be, for example, monosilanes, and disilanes. The monosilanes can be, for example, halogenated silanes, organohalosilanes, or mixtures thereof. The halogenated silanes can be, for example, tetrachlorosilane, trichlorosilane, dichlorosilane, monochlorosilane, tetrabromosilane, tribromosilane, tetraiodosilane, triiodosilane, or mixtures thereof. Organohalosilanes can be, for example, methyltrichlorosilane, ethyltrichlorosilane, methyltribromosilane, ethyltribromosilane, methyltriiodosilane, ethyltriiodosilane, phenyltrichlorosilane, or mixtures thereof.

The silanes can be disilanes, for example, halogenated disilanes, organohalodisilanes, or mixtures thereof. The halogenated disilanes can be, for example, chlorodisilane, dichlorodisilane, trichlorodisilane, tetrachlorodisilane, hexachlorodisilane, bromodisilane, dibromodisilane, or mixtures thereof. The silanes can be organohalodisilanes, for example, methyltrichlorodisilane, dimethyltetrachlorodisilane, ethyltrichlorodisilane, methyltribromodisilane, ethyltribromodisilane, methyltriiododisilane, ethyltriiododisilane, or mixtures thereof. The silanes may contain a minor component of disiloxanes, which can also be separated from the particulate silicon by the described process. Preferred is a by-product stream where the silanes are halosilanes and halodisilanes.

By particulate silicon is meant, solid silicon that is amorphous or crystalline in structure. The size of the particulate silicon is not important as long as the liquid containing particulate silicon and silanes can be atomized. The size of the particulate silicon can be in a range of less than one micron to 500 microns in diameter. Preferred is when the size of particulate silicon is in a range of less than one micron to 50 microns in diameter. The most preferred size of particulate silicon is less than one micron in diameter. The upper limit of the silicon particle size is determined by the atomizing nozzle port size.

The by-product stream is atomized into a heated zone to effect vaporization of the silanes. Atomization of the by-product stream can be effected by standard means for atomizing liquids, for example, high pressure injection or sonification. Preferred is when atomization is effected by high pressure injection through an atomizing nozzle. The atomizing nozzle can be, for example, a pressure type, a hollow cone type, a solid cone type, a fan spray type, a bypass type, a poppet type, a dual-orifice type, a two-fluid type, a sonic type, an ultra-sonic type, a rotary wheels type, a rotary disks type, or a rotary cups type. Preferred is when the atomizing nozzle is a two-fluid pressure type, comprising two concentric channels.

A preferred two-fluid atomizing nozzle consists of an inner concentric channel for feeding the by-product stream into the heated zone, and an outer concentric channel for feeding a high pressure atomizing gas, which facilitates atomization of the by-product stream. The by-product stream and the high pressure atomizing gas can be mixed either internally, while inside the two-fluid atomizing nozzle, or externally, upon expulsion into the heated zone. Preferred is when the by-product stream and the high pressure atomizing gas are mixed externally in the heated zone.

The high pressure atomizing gas fed through the outer concentric channel of the atomizing nozzle can be any inorganic or inert gas that can be fed under high pressure to facilitate the atomization process. The high pressure atomizing gas can be an inorganic gas, for example, hydrogen chloride, hydrogen bromide, hydrogen iodide, or nitrogen. The high pressure atomizing gas can be an inert gas, for example, argon, helium, or neon. Preferred is when the high pressure atomizing gas is an inorganic gas. More preferred, when the by-product stream is from CVD of silicon, is when the high pressure atomizing gas is hydrogen chloride.

The atomized by-product stream containing silanes and particulate silicon is passed into a heated zone to effect vaporization of the silanes. The heated zone is created by introducing a preheated gas into the area immediately adjacent to the exit of the atomizing nozzle. The preheated gas can be any gas that can be preheated to a temperature sufficient to vaporize the atomized by-product stream into gaseous silanes. The preheated gas can be, for example, an inorganic gas as previously described, an inert gas as previously described, monosilanes as previously described, hydrogen, or a mixture thereof.

Preferred is when the preheated gas is a mixture of a hydrogen halide and an amount of hydrogen sufficient to depress the dew point of the gaseous mixture within the vaporization chamber below the vaporization temperature of the silanes. More preferred is when the preheated gas is a mixture of hydrogen chloride and hydrogen. The hydrogen gas can be about 10 to 50 volume percent of the preheated gas. Preferred is when the hydrogen gas is about 30 to 35 volume percent of the preheated gas.

The preheated gas can be introduced into the heated zone in a manner that is either co-current or counter-current with respect to the flow of the atomized by-product stream into the heated zone. Preferred is when the preheated gas is fed co-currently with the by-product stream.

The heated zone is maintained at a temperature within a range of 35° C. to 750° C. Preferred is when the heated zone is maintained at a temperature within a range of 50° C. to 500° C. More preferred is when the heated zone is maintained at a temperature within a range of 100° C. to 300° C. The liquid phase of the atomized by-product stream is vaporized to gaseous silanes in the heated zone, resulting in particulate silicon entrained in gaseous silanes.

The gaseous silanes are a mixture with process gases. The process gases include any gas used in the process to facilitate the separation of the particulate silicon from the liquid by-product stream containing silanes. The process gases include the preheated gas, the high pressure atomizing gas, and a mixture thereof. The process gases are separated along with the gaseous silanes from the particulate silicon.

The gaseous silanes can be separated from the particulate silicon by standard means for separating particulates from gases, for example, filtration, agglomeration, electrostatic prepcipitation, or cyclon filtration. In a preferred embodiment, the gaseous silanes carry the particulate silicon to a filtration area where the particulate silicon is filtered from the gaseous silanes.

Any standard method of filtration for separating a gas-solid mixture can be used to effect the separation of the particulate silicon from the gaseous silanes. Filtration can be conducted using a batch-type filter positioned, for example, in a pressure vessel. The filter can contain, for example, vertical leaf, horizontal leaf, or tubular filter elements. Preferred is when the filter elements are of the tubular type, and positioned vertically in the filtration area.

The filter elements can be formed from, for example, porous metals, woven fibers, or polymer membranes. Preferred is when the filter elements are porous metal. The porous metal can be constructed from an elemental metal or an alloy. The porous metal can be constructed from an elemental metal, for example, copper and nickel. The porous metal can be constructed from an alloy, for example, steel or stainless steel. The porous metal can be constructed from an alloy comprising, for example, copper, nickel, iron, chromium, molybdenum, or tungsten. Preferred is when the porous metal is constructed from a stainless steel.

Particulate silicon entrained in the gaseous silanes is collected by the filter elements as the gaseous silanes pass through the filter elements. In a preferred embodiment, the particulate silicon accumulated by the filter elements is periodically purged by a pulsed gas and directed into a collection device for further silicon recovery. The pulsed gas can be any inorganic or inert gas as previously described. The recovered silicon can either be disposed of by standard means or used as a feed to other processes.

The separated gaseous silanes can be used as feed to appropriate processes. In a preferred embodiment, the gaseous silanes are treated to convert disilanes to monosilanes, and the monosilanes are then recycled to the process generating the by-product stream.

In the instant process, the filter can either be enclosed in a separate filtration chamber or located in a filtration area incorporated within the vaporization chamber containing the heated zone. Preferred is when the process is conducted in one chamber containing both the heated zone and the filter. This one-chamber design eliminates potential fouling problems that may occur in the conduit connecting the units in the individual vaporization and filtration design. In a preferred embodiment, the filtering elements are arranged in a concentric configuration around the perimeter of the vaporization chamber.

A particle remover device is employed to dislodge adhering silicon from the filtration chamber walls in the case of the individual vaporization and filtration design, and in the case of the vaporization chamber in the one-chamber design. The particle remover device can be any means of dislodging solid particles from container walls. The particle remover device can be, for example, a high frequency vibrator device or a mechanical rapper device. Preferred is when the particle remover device is a mechanical rapper device.

To maintain the atomized by-product stream in its gaseous phase, the temperature within the heated zone, the filtration area, and connecting conduit must be maintained above the dew point of the gaseous silanes. A means for maintaining the temperature of the vaporization chamber and filtration area above the dew point of the gaseous silanes can be, for example, a fluid heated jacket, an electrical heated jacket, or an insulation jacket. Preferred is when the vaporization chamber, filtration area, and connecting conduit are enclosed in a heated jacket through which a heated fluid can be passed.

The heated jacket also assists in maintaining a constant temperature during any chemical reaction in the gaseous mixture. Possible chemical reactions occurring in the instant process can be, for example, halogenation of the disilanes, cleavage of the Si-Si bond of disilanes, and halogenation of silicon.

Such halogenation reactions and cleavage of the Si-Si bond generally require the presence of a catalyst. But thermal energy available in the heated zone of the instant process can activate these reactions and cause them to occur in the separation process. Thus, not only does the instant process isolate the particulate silicon from the gaseous silanes, but the process can also partially convert disilanes into useful monosilanes.

The following example is offered as illustrative of the described process. This example is not intended to limit the scope of the described invention.

Example. The ability of the instant process to remove particulate silicon from a liquid by-product stream containing silanes was evaluated. The liquid by-product stream was from a chemical vapor deposition process for making high purity silicon.

The process employed a vaporization chamber and a filtration chamber. The vaporization chamber comprised a cylindrical upper section with a height of 0.9 m, an inner diameter of 0.3 m, and a 60 degree cone shape lower section. The vaporization chamber contained an atomizing nozzle with a height of 23 cm and two concentric channels. The atomizing nozzle was purchased from Spraying Systems Co., Wheaton, Ill. The inner concentric channel of the atomizing nozzle had a 0.64 cm inner diameter, and served as the conduit for the liquid by-product stream containing silanes and particulate silicon. The outer concentric channel of the atomizing nozzle had a 2.5 cm inner diameter and served as the conduit for high pressure HCl gas, that served as an atomizing agent for the by-product stream. A separate conduit introduced into the vaporization chamber a preheated gaseous mixture of HCl and hydrogen to provide a heated zone in the vaporization chamber to effect the vaporization of the liquid by-product stream into gaseous silanes.

The vaporization chamber, filtration chamber, and connecting conduit were enclosed in a heated jacket through which a heated fluid was passed at a temperature of 200° C., to maintain the temperature of the chambers and conduit at about 145° C., which is above the dew point of the gaseous silanes. An air-driven high frequency vibrator device contacted the walls of the vaporization chamber to provide a means of dislodging particulate silicon from the walls of the vaporization chamber.

The filtration chamber, for separating the particulate silicon from the gaseous silanes, comprised a pressure vessel purchased from Mott Metallurgical Corporation, Farmington, CT. The pressure vessel had a height of 1.7 m and an inner diameter of 20 cm. The filtration chamber contained four filter elements formed from inconel. Each filter element was of tubular configuration with a 6 cm diameter, a 1.4 m height, and a 5 micron element rating.

The liquid by-product stream was introduced into the vaporization chamber through the inner concentric channel of the atomizing nozzle. The liquid by-product stream comprised a slurry of tetrachlorosilane, other monosilanes, disilanes, trace amounts of disiloxanes, trace amounts of organohalosilanes, and particulate silicon. The composition of the liquid by-product stream is reported in Table 1. The liquid by-product stream passed through the inner concentric channel of the atomizing nozzle at a flow rate of 91 kg/h, a pressure of 0.28 bar and a temperature of 155° C. High pressure atomizing HCl gas was fed through the outer concentric channel of the atomizing nozzle at a flow rate of 68 kg/h, a pressure of 0.43 bar, and a temperature of 100° C. The high pressure atomizing HCl gas mixed with the liquid by-product stream upon expulsion into the vaporization chamber and atomized the liquid by-product stream.

A gaseous mixture of HCl and hydrogen was preheated to 240° C. and was fed co-currently, with respect to the flows of the liquid by-product stream and the high pressure atomizing HCl gas, into the vaporization chamber to provide a heated zone for vaporization of the liquid components of the atomized by-product stream. The preheated gaseous mixture of HCl and hydrogen was fed into the vaporization chamber at a HCl gas flow rate of 45 kg/h, a hydrogen gas flow rate of 5 L/s, and a total pressure of 0.26 bar.

The gaseous silanes and particulate silicon were passed from the vaporization chamber at a temperature of about 145° C. to the filtration chamber to effect separation.

A hydrogen purge gas was periodically pulsed through the inside of the tubular filter elements to dilodge the separated particulate silicon from the filter elements. The separated particulate silicon was removed from the filtration chamber to a collection device for further silicon recovery. The separated gaseous silanes from the filtration chamber were fed into a process that recovered tetrachlorosilane and trichlorosilane for feed to a chemical vapor deposition process.

Samples of the inlet liquid by-product stream, fed into the vaporization chamber (Before), and effluent gaseous silanes stream, from the filtration chamber (After), were analyzed by gas chromatography using a flame ionization detector, the results of which are reported in Table 1. The row headings "Wt % STC," "Wt % TCS," "Wt % Tetra-CDS," "Wt % Penta-CDS," "Wt % Hexa-CDS," and "Wt % Other" denote the composition of tetrachlorosilane, trichlorosilane, tetrachlorodisilane, pentachlorodisilane, hexachlorodisilane, and "Other" compounds, respectively, in each stream. Particulate silicon comprised 75 weight percent of the components in the "Other" category. Compounds also classified in the "Other" category include dichlorosilane, methyltrichlorosilane, chlorodisilane, dichlorodisilane, and chlorodisiloxane.

TABLE 1

Composition of By-Product Stream Before and After the Spray Dryer Separation Process

|  | Before | After |
|---|---|---|
| Wt % STC | 52.1 | 79.4 |
| Wt % TCS | 0.33 | 3.21 |
| Wt % Tetra-CDS | 1.51 | 0.01 |
| Wt % Penta-CDS | 19.6 | 5.81 |
| Wt % Hexa-CDS | 24.6 | 10.9 |
| Wt % Other | 1.86 | 0.67 |

Particulate silicon removed from the by-product stream had a particle size of less than 1 micron to 50 microns in diameter. The results of Table 1 show that the instant separation process removes particulate silicon from a liquid by-product stream containing silanes. The results of Table 1 also indicate that the process results in chlorination and chemical conversion of some of the disilanes into monosilanes.

What is claimed is:

1. A process for separating particulate silicon from a liquid by-product stream containing silanes, the process comprising:
   (A) atomizing a liquid by-product stream comprising silanes and particulate silicon,
   (B) passing the atomized liquid by-product stream through a heated zone maintained at a temperature sufficient to convert the silanes to gaseous silanes, and
   (C) separating the gaseous silanes from the particulate silicon.

2. A process according to claim 1, where the silanes comprise halosilanes and halodisilanes.

3. A process according to claim 1, where separating the gaseous silanes from the particulate silicon is effected by filtration.

4. A process according to claim 1, where the liquid by-product stream is atomized by passing through an atomizing nozzle.

5. A process according to claim 4, where the liquid by-product stream is co-fed with a high pressure atomizing gas through the atomizing nozzle.

6. A process according to claim 5, where the atomizing nozzle comprises an inner concentric channel and an outer concentric channel; and the liquid by-product stream is fed through the inner concentric channel and the high pressure atomizing gas is fed through the outer concentric channel; and the liquid by-product stream is atomized by contacting the high pressure atomizing gas upon expulsion into the heated zone.

7. A process according to claim 6, where the atomized liquid by-product stream is directed into a vaporization chamber containing the heated zone, and the heated zone is maintained at a temperature within a range of 35° C. to 750° C.

8. A process according to claim 7 where the heated zone is maintained at a temperature within a range of 100° C. to 300° C.

9. A process according to claim 7, where a preheated gas is fed into the vaporization chamber to provide the heated zone.

10. A process according to claim 9, where the preheated gas is fed co-currently with respect to the flows of the liquid by-product and high pressure atomizing gas.

11. A process according to claim 10, where the high pressure atomizing gas is selected from a group consisting of inert gases and hydrogen halides; and the preheated gas is selected from a group consisting of inert gases, hydrogen, hydrogen halides, monosilanes, and mixtures thereof.

12. A process according to claim 11, where the high pressure atomizing gas is hydrogen chloride.

13. A process according to claim 12, where the preheated gas is a gaseous mixture of hydrogen and hydrogen chloride.

14. A process according to claim 11, where the particulate silicon is separated from the gaseous silanes by a filtration means.

15. A process according to claim 14, where the filtration means is contained in the vaporization chamber comprising the heated zone.

16. A process according to claim 14, where the filtration means is contained in a separate filtration chamber connected to the vaporization chamber comprising the heated zone.

17. A process according to claim 15, where inner walls of the vaporization chamber are maintained at a temperature above the dew point of the gaseous silanes.

18. A process according to claim 15, where walls of the vaporization chamber are contacted with a means for removing adhering particulate silicon from the walls.

19. A process according to claim 1, where the liquid by-product stream results from the chemical vapor deposition of trichlorosilane to form elemental silicon.

20. A process according to claim 1, where the separated gaseous silanes are fed to a process for a catalytic conversion of disilanes to monosilanes and the monosilanes are recycled to a chemical vapor deposition process.

21. A process for separating particulate silicon from a liquid stream containing silanes, the process comprising:
(A) atomizing a liquid stream comprising silanes and particulate silicon,
(B) passing the atomized liquid stream through a heated zone maintained at a temperature sufficient to convert the silanes to gaseous silanes, and
(C) separating the gaseous silanes from the particulate silicon.

* * * * *